United States Patent [19]

Karasawa

[11] Patent Number: 5,546,409
[45] Date of Patent: Aug. 13, 1996

[54] ERROR CORRECTION ENCODING AND DECODING SYSTEM

[75] Inventor: Katsumi Karasawa, Kawasaki, Japan

[73] Assignee: Canon Kabushiki Kaisha, Tokyo, Japan

[21] Appl. No.: 378,089

[22] Filed: Jan. 25, 1995

Related U.S. Application Data

[63] Continuation of Ser. No. 913,019, Jul. 14, 1992, abandoned.

[30] Foreign Application Priority Data

| Jul. 18, 1991 | [JP] | Japan | 3-178442 |
| Jul. 18, 1991 | [JP] | Japan | 3-178443 |
| Aug. 28, 1991 | [JP] | Japan | 3-217234 |

[51] Int. Cl.⁶ .................................. H03M 13/00
[52] U.S. Cl. ............... 371/37.4; 371/40.4; 371/49.1; 371/51.1
[58] Field of Search .............. 371/37.4, 37.1–37.9, 371/38.1, 39.1, 40.1–40.4, 41–45, 49.3, 49.4, 50.1, 51.1, 49.1

[56] References Cited

U.S. PATENT DOCUMENTS

| Re. 33,462 | 11/1990 | Suzuki et al. | 371/37.5 |
| 3,685,016 | 8/1972 | Eachus | 340/146.1 |
| 4,044,328 | 8/1977 | Herff | 340/146.1 AG |
| 4,413,340 | 11/1983 | Odaka et al. | 371/39 |
| 4,597,083 | 6/1986 | Stenerson | 371/37 |
| 4,637,021 | 1/1987 | Shenton | 371/37 |
| 4,680,764 | 7/1987 | Suzuki et al. | 371/40.2 |
| 4,779,276 | 10/1988 | Kashida et al. | 371/57 |
| 4,796,260 | 1/1989 | Schilling et al. | 371/39 |
| 4,796,261 | 1/1989 | Morikaki | 371/40 |
| 4,958,350 | 9/1990 | Worley, III et al. | 371/37.4 |
| 5,060,221 | 10/1991 | Sako et al. | 371/37.4 |
| 5,392,299 | 2/1995 | Rhines et al. | 371/37.5 |

FOREIGN PATENT DOCUMENTS

| 0357461 | 3/1990 | European Pat. Off. . |
| 2-143714 | 6/1990 | Japan . |
| 2191318 | 12/1987 | United Kingdom . |

*Primary Examiner*—Robert W. Beausoliel, Jr.
*Assistant Examiner*—Dieu-Minh Le
*Attorney, Agent, or Firm*—Fitzpatrick, Cella, Harper & Scinto

[57] ABSTRACT

In an error correction encoding system, information codes in the form of a data matrix having row addresses and column addresses are stored in memory. A first error correction encoder extracts the stored addresses from the data matrix in the oblique direction and produces a first error-correcting code word from the information codes extracted in the oblique direction. The information codes are extracted in the oblique direction every n row addresses (where n is an integer equal to or greater than 2). A second error correction encoder extracts the information codes from the data matrix in the row direction and produces a second error-correcting code word from the information codes extracted in the row direction.

12 Claims, 11 Drawing Sheets

FIG.1

| SYNCHRONIZATION DATA | INFORMATION DATA | INNER CODE |

FIG.2

| SYNCHRONIZATION DATA | INFORMATION DATA | INNER CODE |
| SYNCHRONIZATION DATA | INFORMATION DATA | INNER CODE |
| SYNCHRONIZATION DATA | OUTER CODE | INNER CODE |

FIG.3

| SYNCHRONIZATION DATA | INFORMATION DATA | CHECK POINT 1 | INFORMATION DATA | CHECK POINT 2 | INFORMATION DATA | CHECK POINT 3 | INFORMATION DATA | CHECK POINT n |

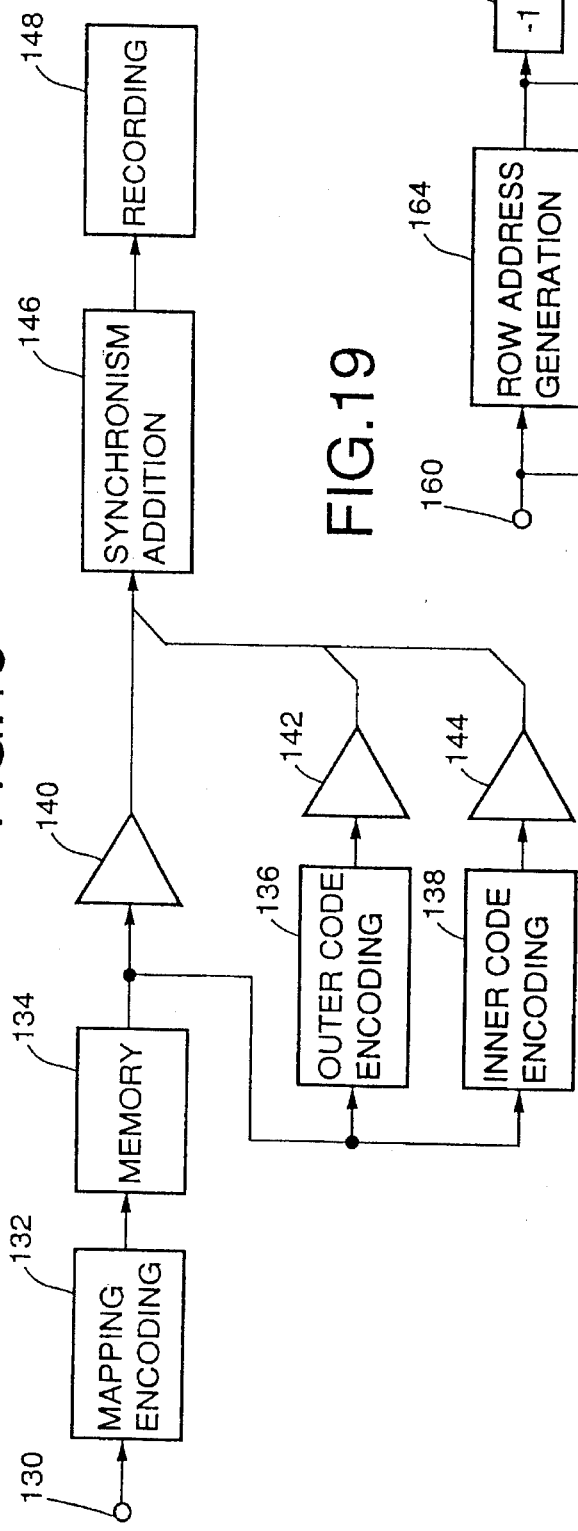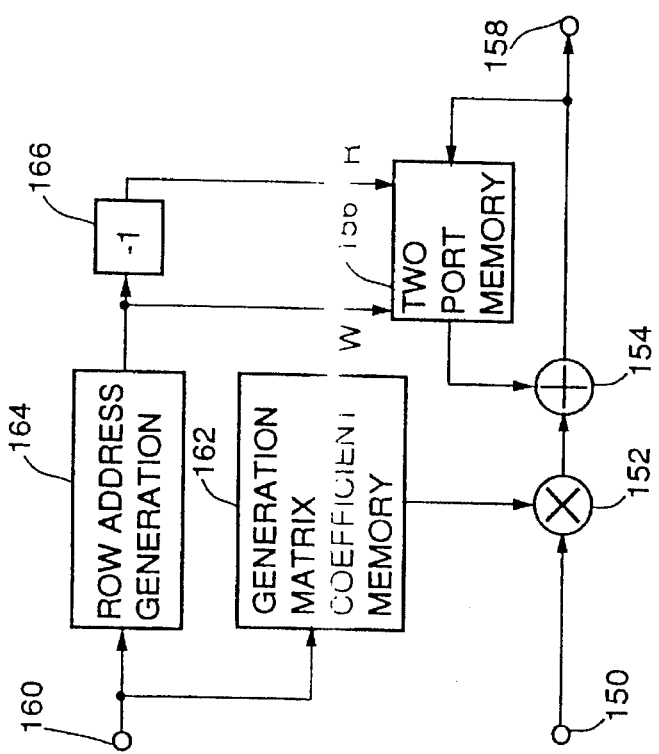

ERROR CORRECTION ENCODING AND DECODING SYSTEM

This application is a continuation of application Ser. No. 07/913,019 filed Jul. 14, 1992, now abandoned.

BACKGROUND OF THE INVENTION

1. Field of the Invention

The present invention relates to an error correction encoding and decoding system. More particularly, this invention is concerned with an error correction encoding and decoding system for producing a product code using inner codes and outer codes.

2. Related Background Art

When digital data transmission is performed to, for example, record or reproduce digital data on or from a magnetic recording medium, low-frequency components of digital codes to be recorded or transmitted on or to a magnetic recording medium or a transmission line must be suppressed. One of the suppressing methods is n-to-m conversion in which n-bit data is converted into m-bit (m>n) data having less low-frequency components. This method, however, increases redundancy and the amount of transmission data.

Mapping encoding, for example, does not increase redundancy. The mapping encoding method can apply to image data or other data whose codes are closely correlated. This method is based on a characteristic that differential signals produced by performing differential encoding on input codes tend to concentrate in the vicinity of a zero level. To be more specific, the differential signals around the zero level are converted into codes of small digital sum values (hereafter, DSV), and thus low-frequency components of the code array are suppressed. 4-to-4 mapping encoding, for example, converts 4-bit differential codes into 4-bit codes.

The mapping encoding uses the correlations among code arrays. Therefore, low-frequency components of codes that are not correlated cannot be suppressed. Error-detecting codes or error-correcting codes are not correlated to one another, in general. Therefore, the low-frequency components of a code array made up of information codes and error-detecting or correcting codes for the information codes are suppressed less efficiently. This results in a high decoding error rate.

FIG. 1 shows an example of a data frame structure for transmitting a code array. The information data area contains mapped codes. To the inner code area, check points (error-correcting codes) of hamming codes or Lead Solomon codes are allocated. FIG. 2 shows a configuration of a data matrix in which data frames, one of which is shown in FIG. 1, are arranged lengthwise and a check point (outer code) is also allocated longitudinally. The data matrix is represented as a product code whose size is provided as a product of transverse codes by longitudinal codes. This matrix has check codes arranged two-dimensionally, which, therefore, is suitable for treating image data and other two-dimensional data.

However, assuming that data frames in the data matrix shown in FIG. 2 are to be transmitted sequentially, when inner codes continue, mapping encoding cannot suppress low-frequency components because of no correlations.

In particular, when it comes to transmitting a data frame made up of only check points of outer and inner codes, check points continue for a long time. This deteriorates the efficiency of suppressing low-frequency components markedly.

The present applicant invented a method of scattering check points of data frames among information codes as shown in FIG. 3, and disclosed the invention in U.S. Pat. No. 4,779,276. As for outer codes forming a product code, the applicant invented a method of re-arranging outer codes produced from columns of a data matrix into rows of the data matrix, then transmitting the outer codes in rows.

However, the former method does not care about outer codes of a product code shown in FIG. 2. The low-frequency components of a data frame made up of only check points of outer and inner codes are not suppressed very efficiently. The latter method has solved this problem. However, an outer code generating mode must be varied in columns, and an outer code encoding start point must also be altered in columns. In particular, when many check points of outer codes are generated, a pattern in which outer code check points do not continue transversely must be selected. Thus, the latter method requires complex processing.

Under these circumstances, the present applicant filed U.S. patent application Ser. No. 491,812 on Mar. 12, 1990 to propose the method below. A data matrix for transmitting data in the order shown in FIG. 4 is scanned as indicated with arrows in FIG. 5 to extract information codes (data) for generating outer codes, then the outer code check points are generated. As disclosed in U.S. Pat. No. 4,779,276, when reference row manipulation is performed on the rows and columns of a check matrix for generating check points, outer code check points can be scattered within a two-dimensional array in memory as shown in FIG. 6. In FIG. 6, outer codes are arranged obliquely. Thus, a data matrix with outer codes thus appended is scanned transversely (in rows), then data is sent to succeeding rows. Thereby, outer code check points are scattered on a time base.

FIG. 7 is a block diagram showing an example of a configuration of a code transmitting system that performs encoding based on oblique scanning shown in FIG. 5. In FIG. 7, 10 denotes an input terminal for inputting information (for example, image signals) to be recorded. A mapping encoding circuit 12 establishes the correlations among information entered at the input terminal 10 and suppresses low-frequencies of the information. The data whose low-frequencies are suppressed by the circuit 12 is written in a memory 14 to create a data matrix. Information codes of the data matrix stored in the memory 14 are read out obliquely as shown in FIG. 5 under the control of an address control circuit 16, then applied to an outer code encoding circuit 18. The outer code encoding circuit 18 generates outer codes. The generated outer code parity bits are written at predetermined locations in the data matrix in the memory 14. The data matrix in the memory 14 are read transversely, then the read data is applied to an inner code encoding circuit 20. The inner code encoding circuit 20 produces inner code parity bits, and applies the parity bits to a synchronism addition circuit 22. The synchronism addition circuit 22 appends synchronization codes to the data. A recording circuit 24 records outputs of the synchronism addition circuit 22 on a magnetic tape, a magnetic or optical disk, or other recording medium.

Here, computation for parity bit generation will be explained briefly. Codes for which a parity bit is generated or M-symboled main information codes are regarded as a matrix I. The matrix I is represented as follows:

$$I = (i_1, i_2, i_3, \ldots i_M)$$

Then, an error-detecting/correcting code word X is represented as follows:

$$X = (i_1, i_2, i_3, \cdots, i_M, x_1, x_2, x_3, \cdots, x_k)$$

where, $x_1$ to $x_k$ represent parity bits. I and X are conditioned as X=I·G, wherein G represents a generation matrix of M rows by (M+K) columns. This matrix computation provides outer codes or parity bits $x_1$ to $x_k$. The generation matrix G is given by the expression (1), wherein the first to M-th columns whose diagonal elements are 1s form a reference matrix and the (M+1)-th to (M+K)-th columns form a matrix of elements $P_{i,j}$.

$$G = \begin{bmatrix} 1000 & \cdots & 0 & P_{1,1} & P_{2,1} & \cdots & P_{K,1} \\ 0100 & \cdots & 0 & P_{1,2} & P_{2,2} & \cdots & P_{K,2} \\ 0010 & \cdots & 0 & P_{1,3} & P_{2,3} & \cdots & P_{K,3} \\ \cdot & & & & & & \cdot \\ \cdot & & & & & & \cdot \\ \cdot & & & & & & \cdot \\ 0000 & \cdots & 1 & P_{1,M} & P_{2,M} & \cdots & P_{K,M} \end{bmatrix} \quad (1)$$

FIG. 8 is a block diagram showing an example of a configuration of a parity calculating circuit that executes matrix computation X=I·G. A generation matrix ROM 11 contains elements $P_{i,j}$ of a generation matrix G at addresses associated with elements of information I read from a memory 14, inputs column and row addresses an address control circuit 16 generates via a terminal 9, then outputs coefficients for the corresponding elements $P_{i,j}$. A Galois field multiplier 13 multiplier the elements $P_{i,j}$ retrieved from the generation matrix ROM 11 by the element of the information I to produce a Galois field. An adder 15 and a delay circuit 17 accumulate outputs of the Galois field multiplier 13. Thus, matrix computation is completed. Herein, Galois field addition pertains to EXCLUSIVE-OR in bits.

As described previously, a data matrix of information codes is scanned obliquely to extract the information codes for producing error-correcting code words. Then, parity check codes are produced. When the parity check codes are appended to a data matrix of information codes row by row, no data frame includes only parity check codes of outer and inner codes. Therefore, low-frequency components are suppressed efficiently.

The above procedure is easier than a procedure in which outer codes are generated in columns of a data matrix of information codes and appended transversely.

However, since information codes are extracted obliquely, an access address for accessing a memory 14 must be varied transversely and longitudinally according to a predetermined program. Furthermore, an address for accessing a generation matrix ROM 11 must also be varied transversely and longitudinally. This disables high-speed processing.

To be more specific, an outer code encoding circuit 18 must repeat a sequence of operations; reading information codes from the memory 14, generating outer codes, then writing the generated outer codes (and read information codes) in the memory 14, and thus complete a whole data matrix. Therefore, a memory of high accessibility must be used.

As described previously, information is scanned obliquely with respect to a direction of data transmission to generate outer codes. Therefore, row addresses or addresses pointing to transverse locations of information data in a matrix shown in FIG. 5, and column addresses or addresses pointing to longitudinal locations of information data in the matrix are required to read elements $P_{i,j}$ from a generation matrix ROM 11. Furthermore, generation matrix coefficients necessary for calculating outer codes differ with a generation matrix.

Therefore, the generation matrix ROM 11 must have a very large capacity. For example, in a data matrix shown in FIG. 9, assuming that the first information code array $I_1$ is represented as:

$$I_1 = (i_{1,1} \ i_{2,1} \ i_{3,1} \cdots i_{M,1})$$

and an error-correcting code word for the first information code array $I_1$ is $X_1$, and that the second information code array 12 is represented as:

$$I_2 = (i_{1,2} \ i_{2,2} \ i_{3,2} \ i_{4,2} \cdots i_{M,2})$$

and an error-correcting code word for the second information code array $I_2$ is $X_2$, $X_1$ and $X_2$ are provided by the expressions (2) and (3) below.

$$X_1 = (i_{1,1} \ i_{2,1} \ i_{3,1} \ldots i_{M,1}) \quad (2)$$

$$X \begin{bmatrix} 1000 & \cdots & 0 & P_{1,1} & P_{2,1} & \cdots & P_{K,1} \\ 0100 & \cdots & 0 & P_{1,2} & P_{2,2} & \cdots & P_{K,2} \\ 0010 & \cdots & 0 & P_{1,3} & P_{2,3} & \cdots & P_{K,3} \\ \cdot & & & & & & \cdot \\ \cdot & & & & & & \cdot \\ \cdot & & & & & & \cdot \\ 0000 & \cdots & 0 & P_{1,M} & P_{2,M} & \cdots & P_{K,M} \end{bmatrix}$$

$$X_2 = (i_{1,2} \ i_{2,2} \ i_{3,2} \ldots i_{M,2}) \quad (3)$$

$$X \begin{bmatrix} 1000 & \cdots & 0 & P_{1,1} & P_{2,1} & \cdots & P_{K,1} \\ 0100 & \cdots & 0 & P_{1,2} & P_{2,2} & \cdots & P_{K,2} \\ 0010 & \cdots & 0 & P_{1,3} & P_{2,3} & \cdots & P_{K,3} \\ \cdot & & & & & & \cdot \\ \cdot & & & & & & \cdot \\ \cdot & & & & & & \cdot \\ 0000 & \cdots & 0 & P_{1,M} & P_{2,M} & \cdots & P_{K,M} \end{bmatrix}$$

When the error-correcting code word $X_2$ is generated, data is read from the data matrix in an order different from a transmission order. Thus, information data $I_2$ is extracted.

In encoding based on oblique scanning, a complex manipulation is required to convert calculated error locations into column and row addresses of information data during decoding.

SUMMARY OF THE INVENTION

The object of the present invention is to provide an error correction encoding system for extracting information codes obliquely from a data matrix of the information codes and producing error-correcting codes, and thus realizing high-speed processing.

Other object of the present invention is to provide an error correction encoding system for performing parallel processing to further speed up the above processing.

To achieve the above objects, the present invention provides an error correction encoding system comprising a memory for storing information codes in the form of a data matrix having row addresses and column addresses, a first error correction encoding means for extracting the information codes from the data matrix obliquely and producing a first error-correcting code word, and a second error correction encoding means for extracting the information codes from the data matrix transversely and producing a second error-correcting code word. Herein, the first error correction encoding means extracts the information codes in n (n is 2 or a larger integer) row addresses.

Other object of the present invention is to ensure easy access to an information memory or a generation matrix memory, and thus further speed up the foregoing processing and provide simple circuitry.

To achieve the above object, the present invention provides an error correction encoding system comprising a storage means for storing information codes in the form of a data matrix having row addresses and column addresses, a first error correction encoding means for extracting the information codes obliquely from the data matrix existent in the storage means and producing a first error-correcting code word, and a second error correction encoding means far extracting the information codes from the data matrix transversely and producing a second error-correcting code word. Herein, the first error correction encoding means includes a memory having only addresses corresponding to the row addresses of the storage means and storing coefficients for generating the first error-correcting code word.

According to another embodiment, the present invention provides an error correction encoding system comprising a storage means for storing information codes in the form of a data matrix having row addresses and column addresses, a first error correction encoding means for extracting the information codes obliquely from the data matrix existent in the storage means and producing a first error-correcting code word, and a second error correction encoding means for extracting the information codes from the data matrix obliquely and producing a second error-correcting code word, wherein the first error correction encoding means includes a multiplying means for multiplying information codes by coefficients for use in generating the first error-correcting code word, and an accumulating means for accumulating information codes that are members of the same error-correcting code word as those being output by the multiplying means. The accumulating means includes a two-port memory having writing addresses or addresses corresponding to the row addresses of information codes to be written, and read addresses or addresses corresponding to the row addresses of immediately preceding information codes that are members of the same error-correcting code word as the information codes to be written are.

The other objects and features of the present invention will be apparent from the detailed description of embodiments in conjunction with the drawings.

BRIEF DESCRIPTION OF THE DRAWINGS

FIG. 1 shows an example of a configuration of a data frame for transmitting a code array;

FIG. 2 shows an example of a configuration of a data matrix having a plurality of data frames each of which is shown in FIG. 1 arranged lengthwise;

FIG. 3 shows check points (parity check codes) scattered among information codes of data frames;

FIG. 18 is a block diagram showing a configuration of a code transmitting system as the third embodiment of the present invention;

FIG. 19 is a block diagram showing an example of a configuration of an outer code encoding circuit shown in FIG. 18;

DETAILED DESCRIPTION OF THE PREFERRED EMBODIMENTS

Embodiments of the present invention will be described in conjunction with the drawings.

Figure 10:
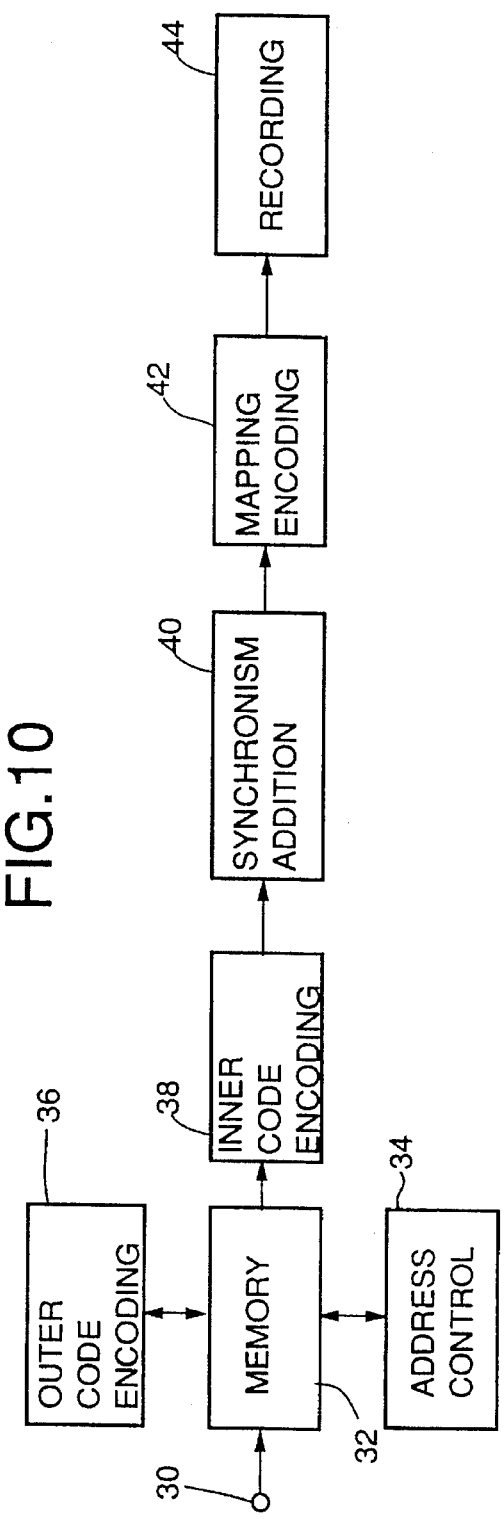
FIG. 10 is a block diagram showing a configuration of a code transmitting system as an embodiment of the present invention.

FIG. 10 is a block diagram showing a configuration of a code transmitting system in an embodiment of the present invention. 30 denotes an input terminal for inputting information codes (for example, image data) to be recorded. 32 denotes a memory in which information codes entered at the input terminal are arranged two-dimensionally. 34 is an address control circuit for controlling access addresses used for accessing the memory 32. 36 denotes an outer code encoding circuit. 38 is an inner code encording circuit. 40 is a synchronism addition circuit for appending synchronization data. 42 denotes a mapping encoding circuit, and 44, a recording circuit for recording data on a recording medium.

Figure 4:
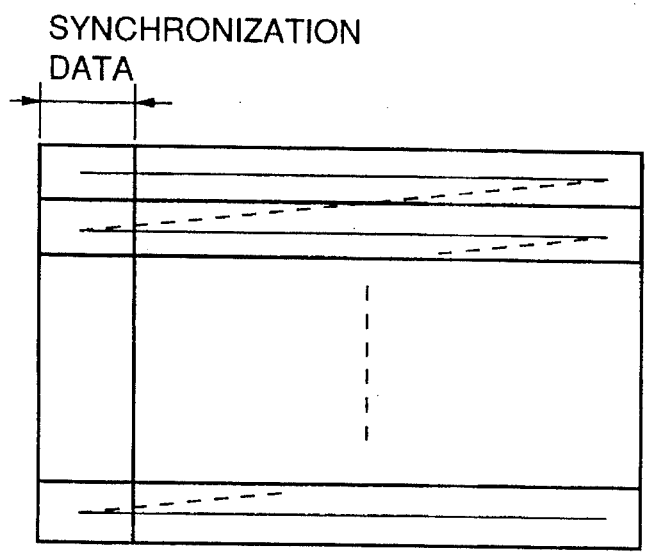
FIG. 4 is an explanatory diagram for explaining a transmission order for transmitting a data matrix.

FIG. 4 shows a data matrix in which synchronization data is appended to information codes that are arranged in the memory 32 two-dimensionally. Arrows in FIG. 4 indicate a code transmission order. Synchronization data appended by the synchronism addition circuit 40 is illustrated to clarify a transmission direction. This is also true for FIG. 11.

Figure 11:
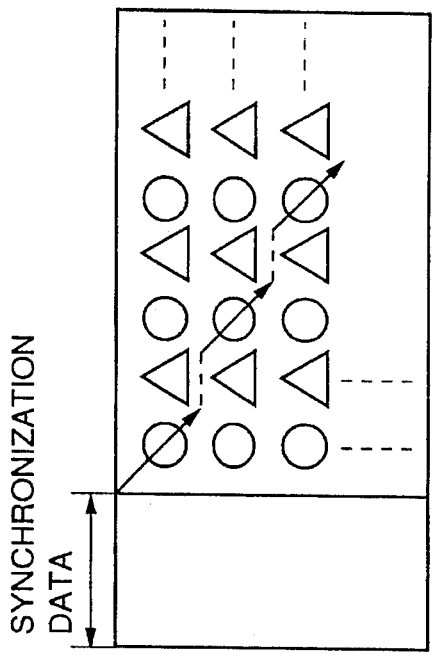
FIG. 11 is a schematic showing how the system shown in FIG. 10 extracts information codes.

An outer code encoding circuit 36 extracts and processes information codes existent in a memory 32 obliquely with respect to a transmission direction as shown in FIG. 11 while differentiating even data (having even row addresses) from odd data (having odd row addresses), then generates outer code check points. Then, the generated outer codes are appended to the trailing ends of data frames (rows).

Figure 12:
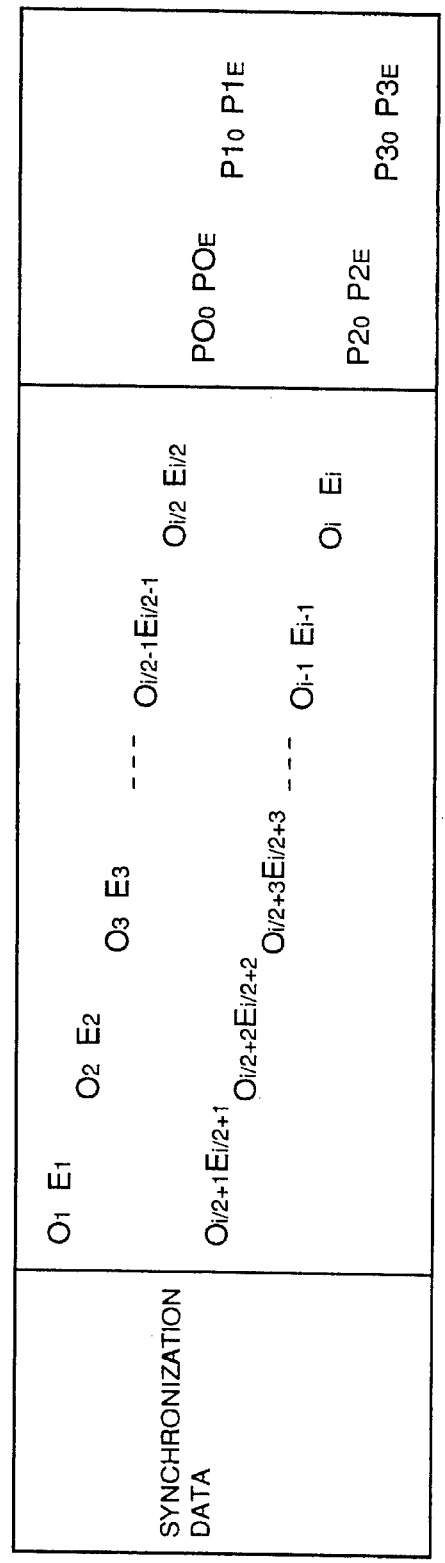
FIG. 12 is a schematic showing how the system shown in FIG. 10 appends parity check codes.

FIG. 12 shows outer code encoding. Data values having odd row addresses $O_1$ to $O_i$ are extracted sequentially as shown in FIG. 12. Then, an outer code encoding circuit 36 generates four parity check codes $P0_O$, $P1_O$, $P2_O$, and $P3_O$. The parity check codes are appended to the trailing ends of rows as shown in FIG. 12. Similarly, data values having even row addresses $E_1$ to $E_i$ are extracted sequentially as illustrated. Then, four parity check codes $P0_E$, $P1_E$, $P2_E$, and $P3_E$ are generated, then appended to the trailing ends of rows as illustrated.

Figure 13:
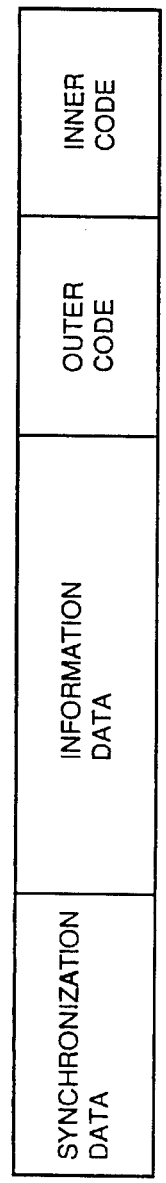
FIG. 13 shows a data frame transmitted by the system shown in FIG. 10.

Information codes and outer codes are read from a memory 32 in the transmission direction (transversely), then applied to an inner code encoding circuit 38. The inner code encoding circuit 38 uses the supplied information codes and outer codes to generate inner codes, then appends the generated inner codes to the trailing ends of rows (data frames) as shown in FIG. 13.

In the process of generating outer and inner codes, a manipulation of scattering check codes P0 to P4 among data frames can be employed as described in U.S. Pat. No. 4,779,276. This minimizes low-frequency components of code arrays transmitted and results in a low occurrence rate of transmission errors.

Figure 5:
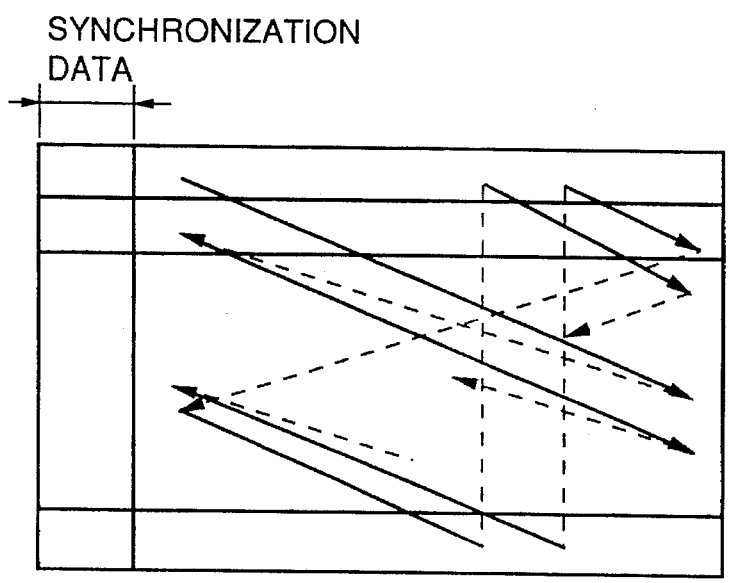
FIG. 5 shows a way of scanning a data matrix obliquely to extract information codes.
Figure 6:
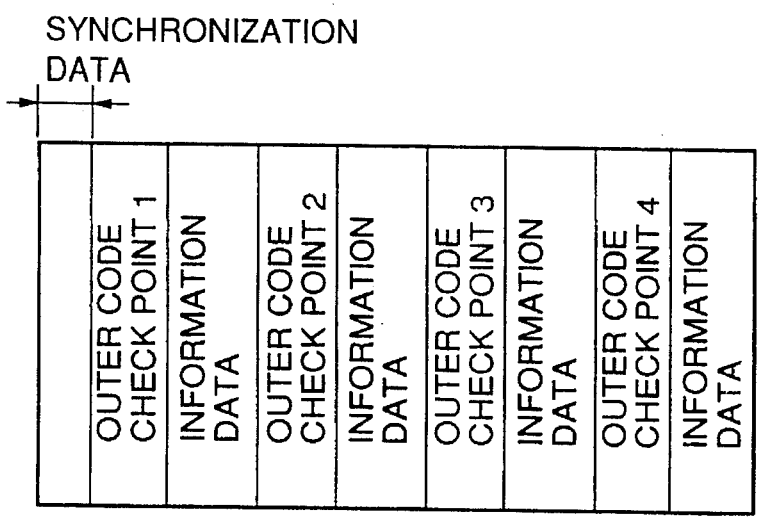
FIG. 6 shows check points for information codes that are scattered among the information codes extracted as shown in FIG. 5.
Figure 7:
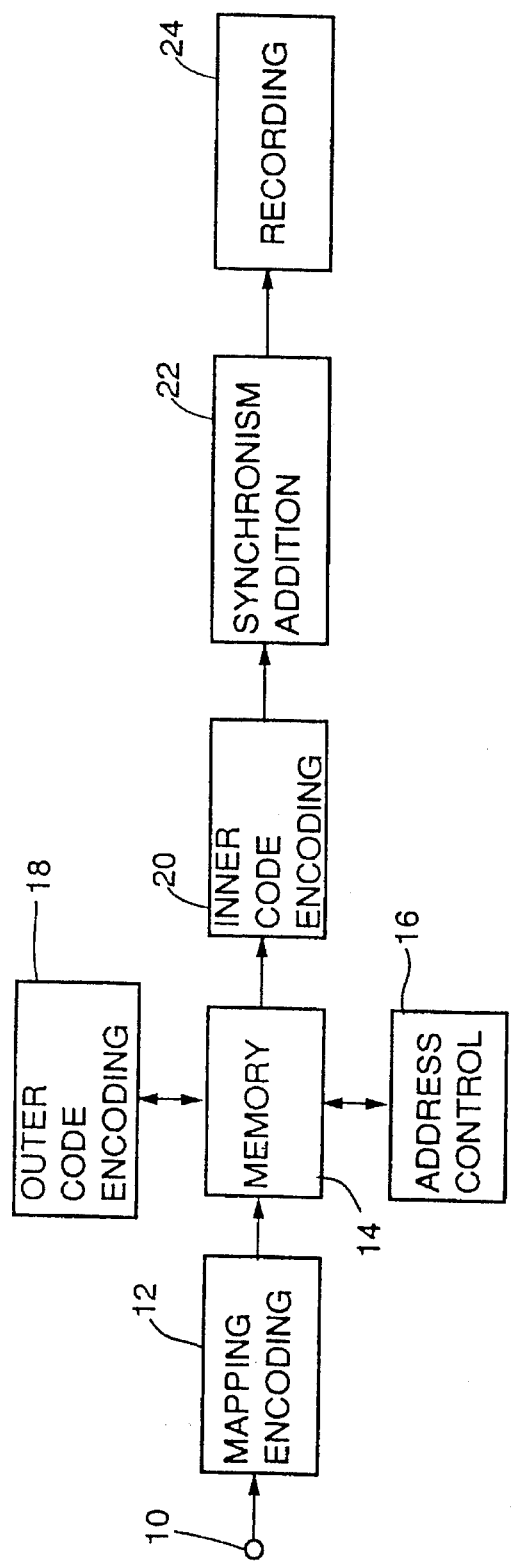
FIG. 7 is a block diagram showing an example of a configuration of a code transmitting system for extracting information codes obliquely as shown in FIG. 5.

After the inner code encoding circuit 38 generates and appends inner-code check codes, a synchronism addition circuit 40 appends synchronization data as shown in FIGS. 4 and 5. A mapping encoding circuit 42 maps the codes to suppress low-frequency components. Finally, a recording circuit 44 records the processed data on a recording medium.

In a code transmitting system having the aforesaid configuration, information codes having odd row addresses and those having even row addresses can be extracted in parallel and even obliquely. When parity check codes are appended to the trailing ends of rows or data frames, parity check codes generated from the information codes having odd row addresses can be appended to rows of odd addresses, and parity check codes generated from the information codes having even row addresses can be appended to rows of even addresses. This allows an outer code encoding circuit 36 to act on fully parallel processing, thus realizing high-speed processing.

Next, a system for reproducing (receiving) code arrays recorded by the system shown in FIG. 10 will be described.

Figure 14:
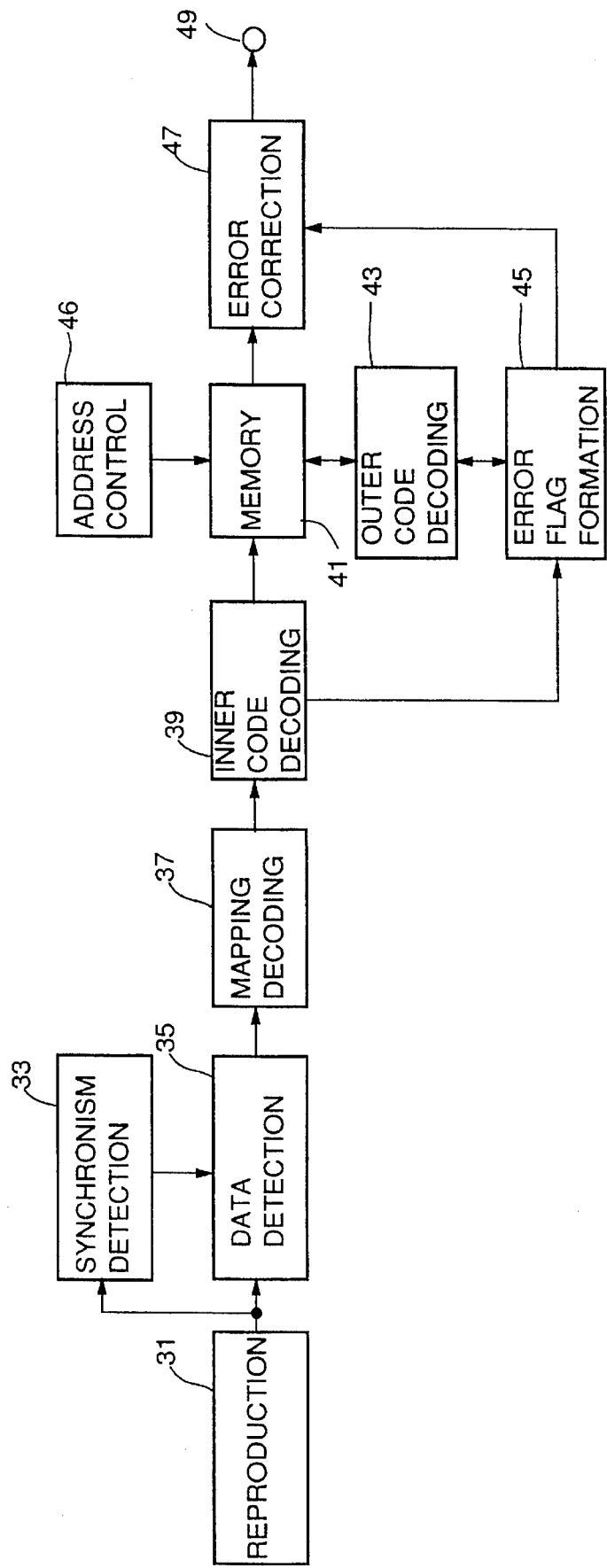
FIG. 14 is a block diagram showing a configuration of a receiving system for receiving code arrays transmitted by the system shown in FIG. 10.

FIG. 14 is a block diagram showing a configuration of a system for reproducing code arrays records on a recording medium by system shown in FIG. 10. A reproduction circuit 31 reproduces code arrays recorded in the aforesaid order. 33 denotes a synchronism detection circuit, which detects synchronization data in the code arrays and generates clock signals synchronous with the synchronization data.

A data detection circuit 35 extracts data signals from the clock signals, and restores original data streams. A mapping decoding circuit returns the restored data streams into original code arrays, then inputs the code arrays to an inner code decoding circuit 39.

The inner code decoding circuit 39 decodes inner codes, and writes codes whose errors are corrected in a memory 41. Inner codes are used to correct errors in data frames and supply information indicating data frames that contain uncorrectable errors to an error flag formation circuit 45.

An outer code decoding circuit 43 accesses the memory 41 under the control of an address control circuit 46, decodes outer codes, then re-writes codes whose errors have been corrected using the outer codes in the memory 41. Even in outer code decoding, check codes and information codes whose row addresses are odd can be processed independently of those whose row addresses are even. Information indicating whether or not uncorrectable data is present is supplied with each error-correcting code word to the error flag formation circuit 45.

Based on the information sent from the inner code decoding circuit 39 and outer code decoding circuit 43, the error flag formation circuit 45 produces an error flag for each information code indicating whether or not the information code is restorable, then outputs the flag at the same time when another information code is read from the memory 41. Information codes are read from the memory 41 in the order shown in FIG. 4. An error correction (concealment) circuit 47 corrects (interpolates) errors according to the error flags.

Information code arrays whose errors have been corrected are supplied via an output terminal 49. An entire sequence of operations from outer code decoding to error correction can be done separately from data of even row addresses to data of odd row addresses. This further speeds up outer code decoding and error correction.

According to the embodiment described in conjunction with FIGS. 10 to 14, codes at odd row addresses and those at even row addresses can be processed independently and in parallel. When an information code matrix is scanned obliquely to acquire information codes and outer codes are produced using the information codes, the encoding and decoding speeds increase drastically.

In the aforesaid embodiment, information codes are extracted every other row address. Needless to say, even when information codes are extracted in units of a (a is 2 or a larger integer) row addresses, the same advantages as those described so far are available.

The second embodiment of the present invention will be described next. The second embodiment attempts to further speed up the operations of an outer code encoding circuit and an outer code decoding circuit.

The overall configurations of an encoding system and a decoding system in this embodiment are identical to those shown in FIGS. 10 and 14. The detailed description of the overall configurations will be omitted. This embodiment is characterized by an outer code encoding circuit and an outer code decoding circuit. Their configurations will be described later.

Figure 9:
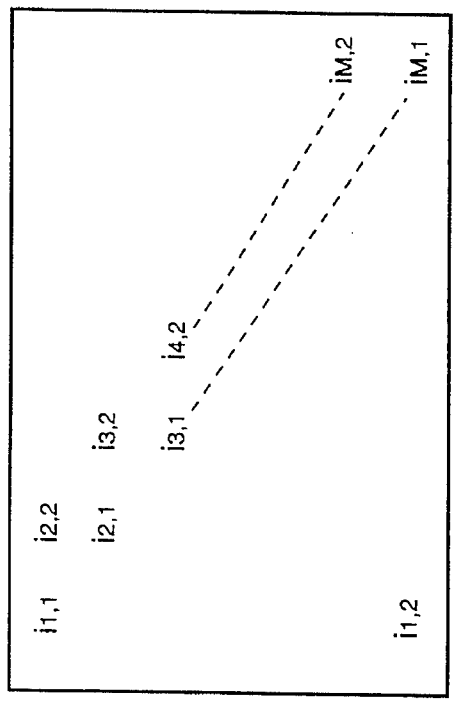
FIG. 9 shows a way of scanning a data matrix obliquely to acquire information code arrays.

Computation for parity bit generation according to this embodiment will be described for a data matrix shown in FIG. 9. One set $I_1$ of codes for which parity bits or M-symboled main information codes are generated is represented as:

$$I_1 = (i_{1,1}\ i_{2,1}\ i_{3,1}\ \text{---}\ i_{M,1})$$

The second information $I_2$ is represented as:

$$I_2 = (i_{2,2}\ i_{3,2}\ i_{4,2}\ \text{---}\ i_{M,2}\ i_{1,2})$$

Error-detecting code words for the first and second information are provided as:

$$X_1 = (i_{1,1}\ i_{2,1}\ i_{3,1}\ \text{---}\ i_{M,1}\ x_{1,1}\ x_{2,1}\ \text{---}\ x_{k,1})$$

$$X_2 = (i_{2,2}\ i_{3,2}\ i_{4,2}\ \text{---}\ i_{M,2}\ x_{1,2}\ x_{2,2}\ \text{---}\ x_{k,2}\ i_{1,2})$$

where, $x_{1,1}$ to $x_{k,1}$ and $x_{1,2}$ to $x_{k,2}$ represents parity bits.

As described previously, a concept of a generation matrix is employed under the condition of Xn=In x Gn. A generation matrix $G_1$ containing $I_1$ and $X_1$ and a generation matrix $G_2$ containing $I_2$ and $X_2$ are given by the expressions (4) and (5) below.

$$G_1 = \begin{bmatrix} 1000 & \ldots & 0 & P_{1,1} P_{2,1} & \ldots & P_{K,1} \\ 0100 & \ldots & 0 & P_{1,2} P_{2,2} & \ldots & P_{K,2} \\ 0010 & \ldots & 0 & P_{1,3} P_{2,3} & \ldots & P_{K,3} \\ & \cdot & & & & \cdot \\ & \cdot & & & & \cdot \\ & \cdot & & & & \cdot \\ 0000 & \ldots & 1 & P_{1,M} P_{2,M} & \ldots & P_{K,M} \end{bmatrix} \quad (4)$$

$$G_2 = \begin{bmatrix} 000 & \ldots & 0 & P_{1,1} P_{2,1} & \ldots & P_{K,1} & 1 \\ 100 & \ldots & 0 & P_{1,2} P_{2,2} & \ldots & P_{K,2} & 0 \\ 010 & \ldots & 0 & P_{1,3} P_{2,3} & \ldots & P_{K,3} & 0 \\ & \cdot & & & & \cdot & \\ & \cdot & & & & \cdot & \\ & \cdot & & & & \cdot & \\ 000 & \ldots & 1 & P_{1,M} P_{2,M} & \ldots & P_{K,M} & 0 \end{bmatrix} \quad (5)$$

$G_2$ is provided when the starting columns of $G_1$ are relocated at the trailing ends of their rows and the entire matrix is shifted leftward. That is to say, $G_2$ is a result of reference row manipulation performed on the $G_1$ matrix. The generation matrix $G_1$ serving as a reference is stored in a generation matrix ROM or a coefficient ROM. Every time a code array is computed to generate outer codes, the coefficients in $G_1$ are shifted and read. Then, information data is extracted sequentially in the transmission order of the data matrix.

Figure 15:
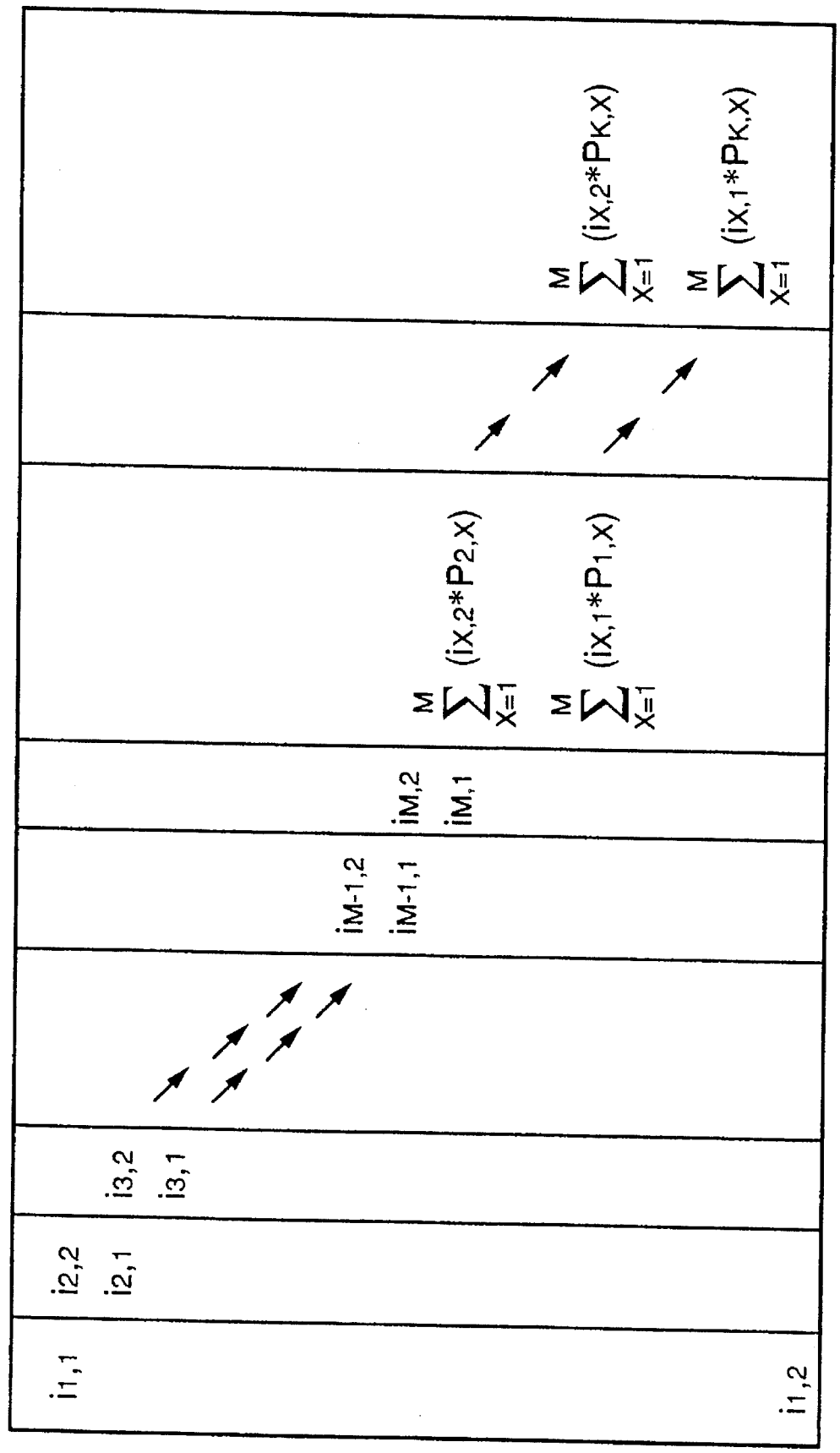
FIG. 15 shows how a code transmitting system of the second embodiment of the present invention produces parity check codes.

FIG. 15 shows a data matrix showing the results of accumulation according to this embodiment. That is to say, information code arrays are multiplied by outer code generation coefficients, then the results of the multiplication are accumulated. Here, a first error-detecting/correcting code word $X_1$ is represented as:

$$\begin{aligned} X_1 = & [(i_{1,1} \times 1 + i_{2,1} \times 0 + \ldots + i_{M,1} \times 0) \\ & (i_{1,1} \times 0 + i_{2,1} \times 1 + \ldots + i_{M,1} \times 0) \ldots \\ & (i_{1,1} \times 0 + i_{2,1} \times 0 + \ldots + i_{M,1} \times 1) \\ & (i_{1,1} \times P_{1,1} + i_{2,1} \times P_{1,2} + \ldots i_{M,1} \times \\ & P_{1,M} \ldots (i_{1,1} \times P_{k,1} + i_{2,1} \times \\ & P_{k,2} + \ldots + i_{M,1} \times P_{k,M})] \\ = & \left[ i_{1,1} i_{2,1} \ldots i_{M,1} \sum_{x=1}^{M} (i_{x,1} \times P_{1,x}) \ldots \right. \\ & \left. \sum_{x=1}^{M} (i_{x,1} \times P_{k,x}) \right] \end{aligned}$$

A second error-detecting/correcting code word $X_2$ is represented as:

$$\begin{aligned} X_2 = & [(i_{2,2} \times 1 + i_{3,2} \times 0 + \ldots + i_{M,2} \times 0 + \\ & i_{1,2} \times 0) (i_{2,2} \times 0 + i_{3,2} \times 1 + \ldots + i_{M,2} \times 0 + \\ & i_{1,2} \times 0) \ldots (i_{2,2} \times 0 + i_{3,2} \times 0 + \ldots + i_{M,2} \times \\ & 1 + i_{1,2} \times 0)(i_{2,2} \times P_{1,2} + i_{3,2} \times P_{1,3} + \ldots \\ & i_{M,2} \times P_{1,M} + i_{1,2} \times P_{1,1}) \ldots (i_{2,2} \times P_{k,2} + \\ & i_{3,2} \times P_{k,3} \ldots + i_{M,2} \times P_{k,M} + i_{1,2} \times \\ & P_{k,1}) (i_{2,2} \times 0 + i_{3,2} \times 0 + \ldots + i_{M,2} \times 0 + \\ & i_{1,2} \times 1)] \\ = & \left[ i_{2,2} i_{3,2} \ldots i_{M,2} \sum_{x=1}^{M} (i_{x,2} \times P_{2,x}) \ldots \right. \\ & \left. \sum_{x=1}^{M} (i_{x,2} \times P_{k,x}) i_{1,2} \right] \end{aligned}$$

Data values on one column forming input information are multiplied by the same coefficient. That is to say, the same coefficients are assigned to the same column addresses (indicating longitudinal locations of an information data matrix) of information codes. Therefore, a generation matrix ROM need store only coefficients associated with row addresses (indicating transverse locations of an information data matrix) of information codes. Therefore, the generation matrix ROM must have only a limited capacity.

Figure 8:
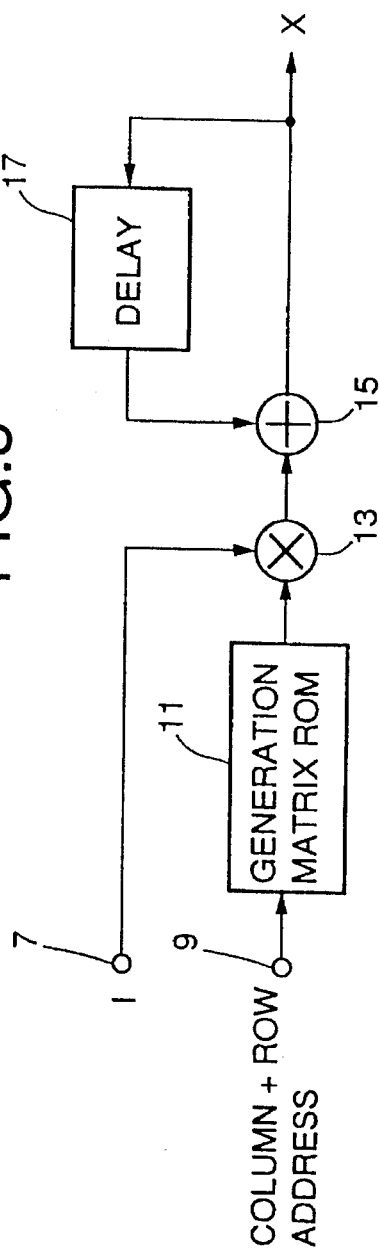
FIG. 8 shows an example of a configuration of a parity calculating circuit for extracting information codes obliquely as shown in FIG. 5.
Figure 16:
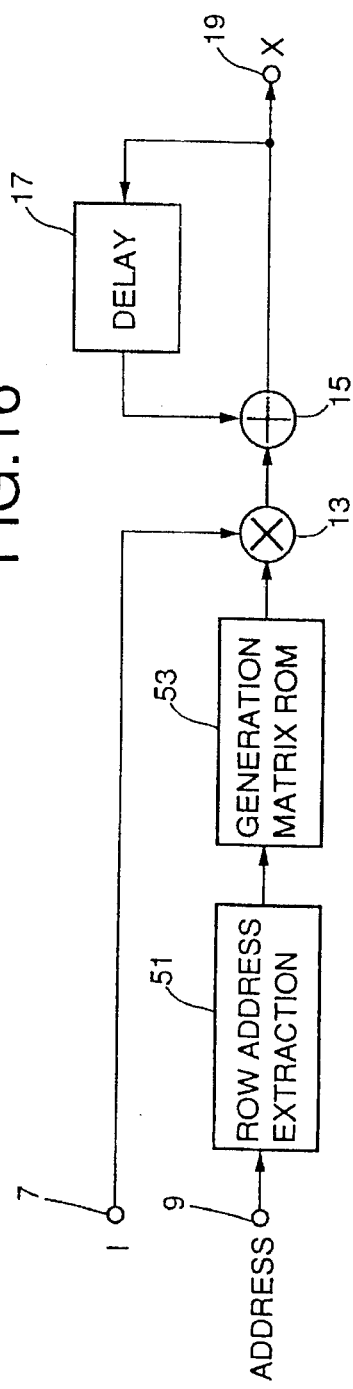
FIG. 16 shows an outline configuration of an outer code encoding circuit in the second embodiment of the present invention.
Figure 17:
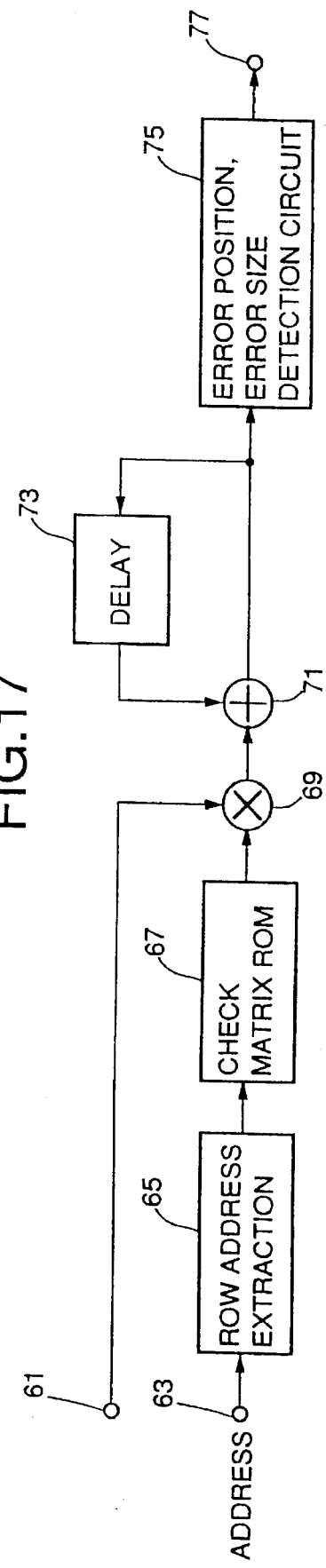
FIG. 17 shows a configuration of an outer code decoding circuit mated with the encoding circuit of FIG. 16.

FIG. 16 shows a configuration of a main section of an outer code encoding circuit in the second embodiment. Components identical to those of FIG. 8 are assigned the same numerals. The description will be omitted.

An address input terminal 9 is provided with row and column addresses of information codes an address control circuit 34 places in memory 22. A row address extraction circuit 51 extracts row addresses.

In a generation matrix ROM 53, coefficients are stored in association with the terms of a generation polynominal in row addresses. The general matrix ROM 53 has a small capacity, as described above.

Next, a configuration of an outer code decoding circuit 43 in the second embodiment will be described.

After information codes and outer-code check codes are read from a memory 41, an address control circuit 46 inputs the read addresses of the read codes to a terminal 61. Row addresses are extracted from the read addresses by a row address extraction circuit 65, then supplied to a check matrix ROM 67. Coefficients for a check matrix read from the check matrix ROM 67 are multiplied by codes sent through the terminal 61. Then, an accumulator made up of a delay circuit 73 an adder 71 handles the multiplied codes to provide syndromes in association with the check codes. These syndromes are supplied to an error location/size detection circuit 75. Then, the locations and sizes of errors are detected to rewrite information codes in the memory via the terminal 77.

As described above, according to the present embodiment, only coefficients associated with row addresses need be stored in a check matrix ROM for decoding. In a system for extracting information codes obliquely from an information code matrix and producing outer codes, the encoding circuit and decoding circuit can be drastically reduced in memory capacity and size. This leads to simple and high-speed processing.

Next, the third embodiment of the present invention will be described.

FIG. 18 is a block diagram showing a configuration of an error correction encoding system according to the third embodiment of the present invention. 130 denotes an input terminal for inputting information (for example, image signals) to be recorded. A mapping encoding circuit 132 establishes the correlations among the information entered at the input terminal 130 and suppresses low-frequency components of the information. The data whose low frequencies are suppressed by the circuit 132 is written in a memory 134 to create a data matrix as described previously. The data matrix stored in the memory 134 is read sequentially and transversely (row by row). Then, the read data is applied to an outer code encoding circuit 136, an inner code encoding circuit 138, and a buffer 140.

FIG. 19 shows a detailed circuit configuration of an outer code encoding circuit 136. In FIG. 19, 150 denotes an input terminal via which information codes read from a memory 134 are supplied. 152 is a Galois field multiplier, and 154, a Galois field adder. 156 denotes a two-port memory. 158 denotes an output terminal for outputting outputs of the adder 154. Data read from the memory 134 is applied to the multiplier 152 via the input terminal 150. Thereby, the data is multiplied by predetermined coefficients that are defined in a generation matrix, then applied to the adder 154. With the input codes of a row on a two-dimensional array, the two-port memory 156 outputs the results of adding code values of the preceding row to the adder 154. The results of the addition the adder 154 provides are re-stored in the two-port memory 156.

160 denotes a terminal for inputting read address information retrieved from the memory 134. A memory 162 for storing generation matrix coefficients provides the multiplier 152 with the generation matrix coefficients associated with the read addresses retrieved from the memory 134.

Figure 20:
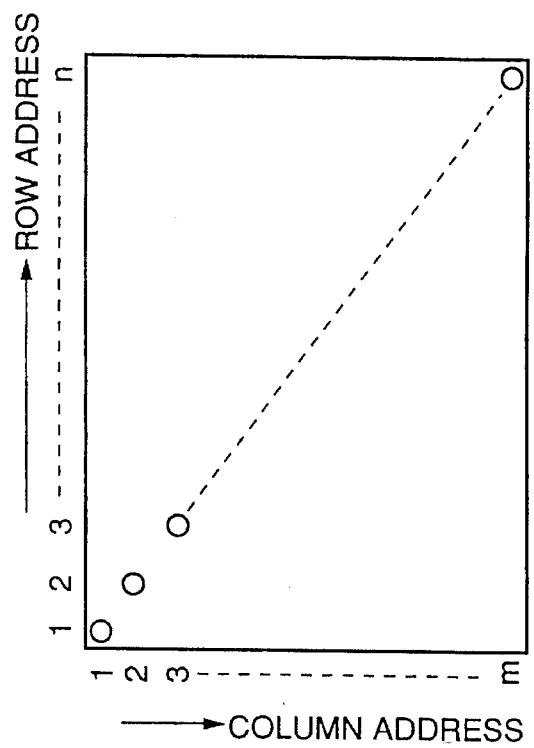
FIG. 20 shows how the system shown in FIG. 18 extracts information codes.

Next, writing addresses and read addresses of a two-port memory 156 will be described in conjunction with FIG. 20. The transverse addresses of all columns of a code array that extends obliquely as indicated with circles in FIG. 20 are used as writing addresses. Row addresses of the preceding array are used as read addresses. Using these writing and read addresses, data is written or read in or from the two-port memory. Thus, oblique scanning permits generation of outer code check points.

To be more specific, when information codes multiplied by coefficients are supplied to an adder 154, the writing addresses for writing the two-port memory 156 are row addresses read from a memory 134. The row addresses are provided by a row address generation circuit 164.

Therefore, the results of addition the adder 154 provides are written at the addresses in the two-port memory 156 that correspond to the row addresses of information codes in a data matrix.

On the other hand, read addresses used at this time are row addresses in the data matrix of information codes that are included in the preceding data frame (array) and members of the same outer-code code word as the information codes currently read from the memory 134 are. When information codes are extracted as shown in FIG. 20, a decrementing device 166 is used to decrement the writing addresses. When a writing address is 1, the corresponding read address shall be n.

Thus, information codes forming a code word are multiplied by generation matrix codes. The resultant values are added up sequentially by the adder 154. When the adder 154 repeats addition by a predetermined number of times determined with a generation matrix, check codes are generated. The generated check codes are supplied via the output terminal 158. The outer-code parity check codes thus generated are applied to a synchronism addition circuit 146 via a buffer 142.

An inner code encoding 138 generates and outputs inner code check points according to a well-known procedure. The generated inner code check points are applied to the synchronism addition circuit 146 via a buffer 144. The synchronism addition circuit 146 is configured by replacing the two-port memory 156 in the circuit shown in FIG. 19 with a one-data delay circuit.

The synchronism addition circuit 146 is provided with information codes read from the memory 134 via a buffer 140 according to the order shown in FIG. 4. The synchronism addition circuit 146 appends synchronization codes to information codes, outer-code parity check codes, and inner-code parity check codes, which are arranged in a predetermined order, in data frames. A recording circuit 148 records outputs of the synchronism addition circuit 146 on a magnetic tape, magnetic disk, optical disk, or other recording medium.

As described previously, according to an encoding system in this embodiment, a memory 134 can be read in the order shown in FIG. 4. Although information codes are extracted obliquely, read addresses of the memory 134 can be specified very easily.

Information codes can be supplied in the same order to an inner code encoding circuit 138 and to an outer code encoding circuit 136. Inner codes and outer codes can be encoded in parallel, thus realizing high-speed processing.

Next, a decoding circuit mated with an encoding circuit shown in FIGS. 18 and 19 will be described.

Figure 21:
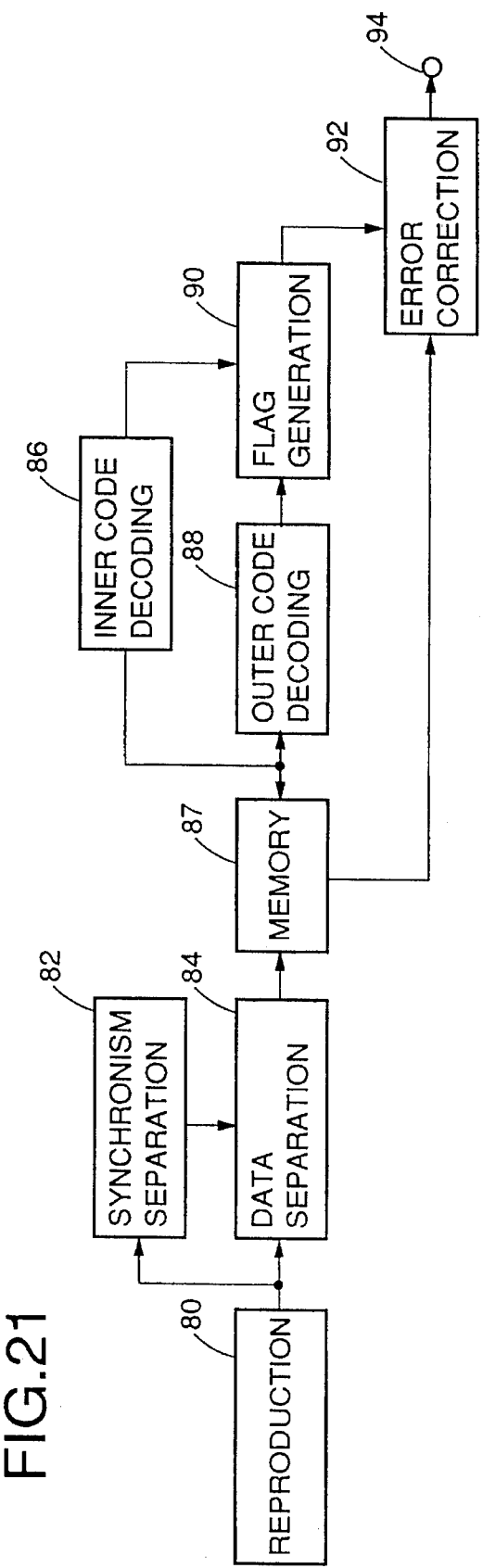
FIG. 21 is a block diagram showing a configuration of a receiving system for receiving code arrays transmitted by the system shown in FIG. 18 transmits.

FIG. 21 shows an outline configuration of an entire reproducing system mated with a recording system shown in FIG. 18. In FIG. 21, 80 is a reproduction circuit for reproducing information and check code arrays from a recording medium. 82 denotes a synchronism detection circuit, which detects synchronization data in the code arrays and generates clock signals synchronous with the synchronization data.

A data separation circuit 84 extracts data with the clock signals and restores original code arrays. The restored code arrays are written at addresses specified as shown in FIG. 4 in memory 87. Information codes and parity check codes of inner and outer codes are read from the memory 87 similarly to the order for writing or the order shown in FIG. 4. Then, the read codes are supplied to an inner code decoding circuit 86 and an outer code decoding circuit 88 in parallel.

An inner code decoding circuit multiplies information codes and inner-code parity check codes by coefficients defined in a check matrix. Then, an accumulator made up of a one-data delay circuit and an adder calculates inner-code syndromes. Based on the syndromes, errors of information codes existent in a memory 87 are corrected.

Figure 22:
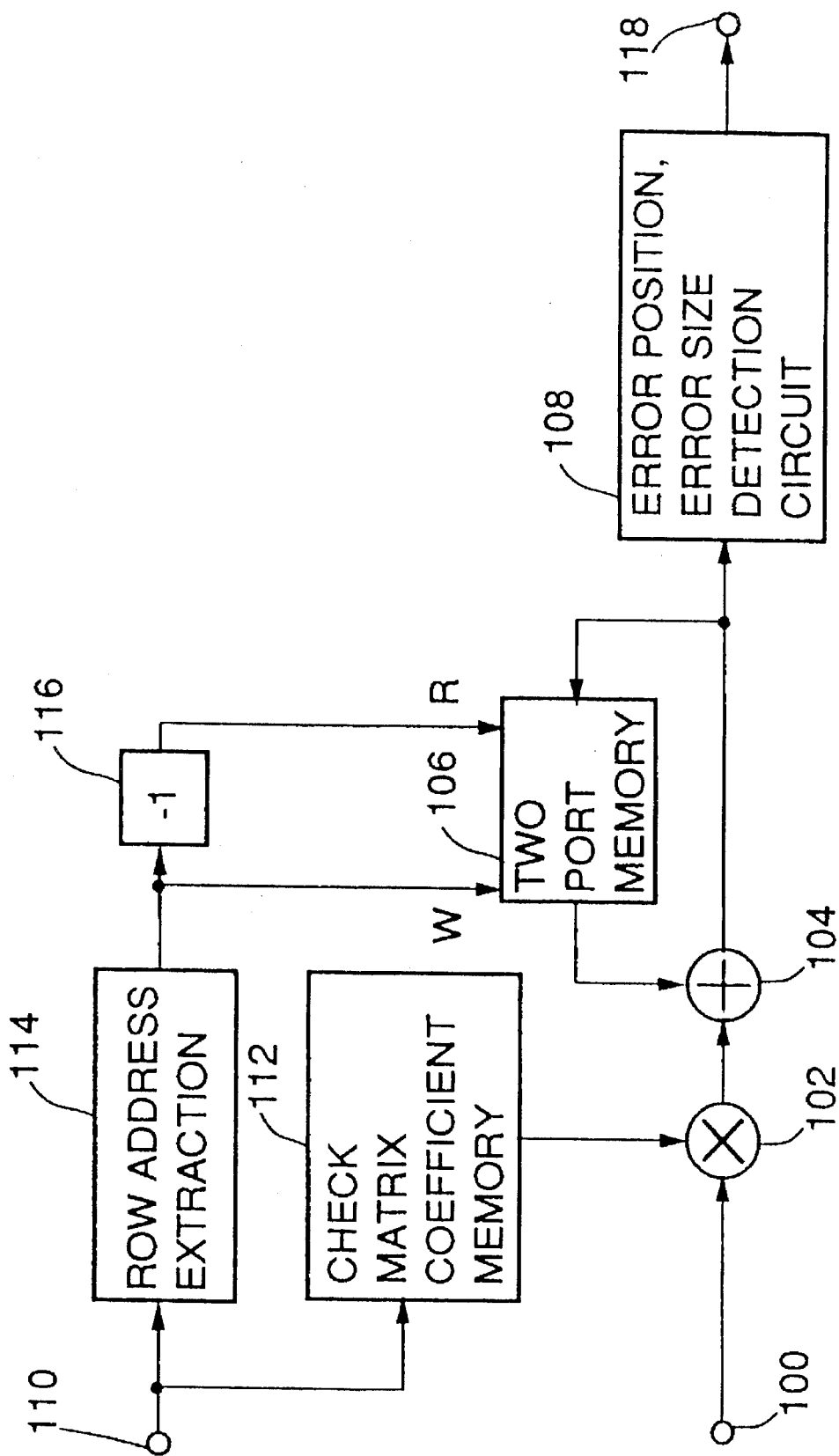
FIG. 22 is a block diagram showing an example of a configuration of an outer code decoding circuit shown in FIG. 21.

On the other hand, an outer code decoding circuit 88 has a configuration shown in FIG. 22. Read addresses of a memory 87 are supplied via a terminal 110, then read information codes and parity check codes are supplied via the terminal 110. In a check matrix coefficient memory, coefficients are fetched from the check matrix according to the read addresses. Then, the fetched coefficients are supplied to a multiplier 102. The outputs of the multiplier 102 are fed to an accumulator made up of an adder 104 and a two-port memory 106.

Herein, addresses corresponding to read row addresses of the memory 87 are used as writing addresses of the two-port memory 106. The row addresses are provided by a row address extraction circuit 114. The read addresses are read row addresses of information codes or parity check codes that are located in the preceding array (data frame) and members of the same code word as the information codes or parity check codes read from the memory 87 are. To produce a code word shown in FIG. 20, a decrementing device 116 must be used to decrement the outputs of the row address extraction circuit 114.

An adder 104 provides syndromes in association with check codes. These syndromes are supplied to an error location/size detection circuit 108. Then, the locations and sizes of errors are detected to rewrite information codes in the memory 87 via a terminal 118.

The information codes whose errors have been corrected are read from the memory 87 in the order shown in FIG. 4, then supplied to an error correction circuit 92. Based on the information sent from the inner code decoding circuit 86 and outer code decoding circuit 88, a flag generation circuit 90 outputs an error flag at the same time when data containing an uncorrectable error is read from the memory 87. With the error flag, the error correction circuit 92 replaces an uncorrectable information code with other code and thus completes correction. Corrected information code arrays are supplied via an output terminal 94.

As described previously, in a system according to the third embodiment of the present invention, outer codes are produced by scanning an information code matrix obliquely. Herein, inner code encoding and outer code encoding, and inner code decoding and outer code decoding alike can be performed in parallel. Thus, high-speed processing is realized. Writing and read addresses of a main memory are all specified in the order of addresses in a data matrix of information codes. Consequently, address management becomes very easy. This helps realize a simple system design and high-speed processing.

What is claimed is:

1. An error correction encoding device comprising:
   a memory for storing information codes in a form of a data matrix having row addresses and column addresses;
   first correction encoding means for reading the information codes from the memory and producing a first error-correcting code word composed of the information codes extracted from the data matrix and first parity check codes generated by using the information codes, said first error correction encoding means extracting the information codes from addresses which have different column addresses and only one of every adjacent n row addresses (where n is 2 or a larger integer) on the data matrix; and
   second error correction encoding means for extracting the information codes from the data matrix in the row direction thereof and producing a second error-correcting code word composed of the information codes extracted from the data matrix and second parity check codes generated by using the information codes, said second error correction encoding means extracting the information codes from addresses which have the same column address on the data matrix.

2. A device according to claim 1 wherein said first error correction encoding means outputs an odd code word composed of odd parity check codes and only information codes whose row addresses are odd and an even code word composed of even parity check codes and only information codes whose row addresses are even as said first error-correcting code word.

3. A device according to claim 2 wherein said first error correction encoding means writes the odd parity check codes at only odd row addresses in the memory, and the even parity check codes at only even row addresses in the memory.

4. A device according to claim 1 wherein said first error correction encoding means writes the first parity check codes at row addresses larger than those of the information codes in the memory, and the memory reads the information codes and the first parity check codes in order of row addresses in units of a data frame including a plurality of information codes and parity check codes whose column addresses are the same.

5. A device according to claim 4 wherein said second error correction encoding means writes the second parity check codes at row addresses larger than those of the first parity check codes in the memory.

6. A code transmitting apparatus comprising:
   input means for inputting information codes;
   a memory for storing the information codes entered at said input means in a form of a data matrix having row addresses and column addresses, said memory writing the information codes sequentially every row of said data matrix;
   error correction encoding means for reading the information codes from the memory and producing an error-correcting code word composed of the information codes extracted from the data matrix and parity check codes generated by using the information codes, said error correction encoding means extracting the information codes from addresses which have different column addresses and only one of every adjacent n row addresses (wherein n is 2 or a larger integer) on the data matrix; and
   transmitting means for transmitting the information codes and the parity check codes forming the error-correcting code word produced by said error correction encoding means in units of a data frame including a plurality of information codes whose column addresses in said memory are the same.

7. An apparatus according to claim 6 further comprising code converting means for converting said information codes into codes whose low-frequency components are suppressed by utilizing correlations among the information codes.

8. An apparatus according to claim 6, wherein said transmitting means includes a synchronism addition means for appending synchronizing code to leading ends of said data frames.

9. An apparatus according to claim 6 wherein said transmitting means includes another error correction encoding means for producing another error-correcting code word in units of the data frame.

10. An error correction code decoding device, comprising:
   a memory for storing first and second check codes and information codes composing first and second error-correcting code words in a form of a data matrix having row addresses and column addresses, the information codes and first check codes, composing the first error-correcting code word, being stored in addresses which have different column addresses and only one of every adjacent n row addresses on the data matrix, and the information codes and second check codes, composing the second error-correcting code word, being stored in addresses which have the same column addresses on the data matrix;
   second error correcting means for reading the information codes and the second check codes from the memory and correcting errors of the information codes, said second error correction means extracting the information codes from addresses which have the same column address on the data matrix; and first error correcting means for reading the information codes and the first check codes from the memory and correcting errors of the information codes, said first error correcting means extracting the information codes from addresses which have different column addresses and only of every adjacent n row addresses (where n is 2 or a larger integer) on the data matrix.

11. A system device according to claim 10 wherein the first error-correcting code word includes an odd code word produced using only information codes whose row addresses are odd and an even code word produced using only information codes whose row addresses are even, and said first error correction means processes the odd code word and the even code word in parallel.

12. A code receiving apparatus, comprising:

input means for inputting check codes and information codes forming an error-correcting code word;

a memory for storing the check codes and the information codes input from said input means in a form of a data matrix having row addresses and column addresses, said memory writing the check codes and the information codes in units of a row of the data matrix; and error correcting means for reading the check codes and the information codes from the memory and correcting errors of the information codes, said error correcting means extracting the information codes from addresses which have different column addresses and only one of every adjacent n row addresses (where n is 2 or a larger integer) on the data matrix.

\* \* \* \* \*

UNITED STATES PATENT AND TRADEMARK OFFICE
CERTIFICATE OF CORRECTION

PATENT NO. : 5,546,409
DATED : August 13, 1996
INVENTOR(S) : KATSUMI KARASAWA

Page 1 of 2

It is certified that error appears in the above-indentified patent and that said Letters Patent is hereby corrected as shown below:

COLUMN 4

Line 9, "array 12" should read --array $I_2$--;
Line 52, "Other" should read --Another--.

COLUMN 5

Line 1, "Other" should read --Another--;
Line 11, "far" should read --for--.

COLUMN 6

Line 7, "codes:" should read --codes;--;
Line 35, "FIG. 18 transmits;" should read --FIG. 18;--.

COLUMN 7

Line 49, "records" should read --recorded--;
Line 50, "system" should read --the system--.

COLUMN 9

Line 49, "$P_{1,M}$..." should read --$P_{1,M}$)...--.

UNITED STATES PATENT AND TRADEMARK OFFICE
CERTIFICATE OF CORRECTION

PATENT NO. : 5,546,409
DATED : August 13, 1996
INVENTOR(S) : KATSUMI KARASAWA

It is certified that error appears in the above-indentified patent and that said Letters Patent is hereby corrected as shown below:

COLUMN 10

Line 36,   "general" should read --generation--.

COLUMN 12

Line 7,    "encoding 138" should read --encoding circuit 138--.

COLUMN 15

Line 12,   "system" should be deleted.

Signed and Sealed this

Seventh Day of January, 1997

BRUCE LEHMAN

*Attesting Officer*     *Commissioner of Patents and Trademarks*